United States Patent
Ooyabu et al.

(10) Patent No.: US 8,664,678 B2
(45) Date of Patent: Mar. 4, 2014

(54) PHOSPHOR CERAMIC AND LIGHT-EMITTING DEVICE

(75) Inventors: Yasunari Ooyabu, Ibaraki (JP); Toshitaka Nakamura, Ibaraki (JP); Hironaka Fujii, Ibaraki (JP); Hisataka Ito, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 59 days.

(21) Appl. No.: 13/167,286

(22) Filed: Jun. 23, 2011

(65) Prior Publication Data

US 2012/0001214 A1 Jan. 5, 2012

(30) Foreign Application Priority Data

Jun. 30, 2010 (JP) ................................ 2010-149094

(51) Int. Cl.
*H01L 33/44* (2010.01)

(52) U.S. Cl.
USPC ............... 257/98; 13/79; 13/103; 13/E33.061

(58) Field of Classification Search
USPC ................. 257/98, E33.061, 13, 79, E51.018
See application file for complete search history.

(56) References Cited

U.S. PATENT DOCUMENTS

| | | | |
|---|---|---|---|
| 8,159,131 B2 * | 4/2012 | Helbing | 313/512 |
| 2009/0001390 A1 * | 1/2009 | Yan et al. | 257/89 |
| 2009/0061549 A1 | 3/2009 | Harada et al. | |
| 2009/0072710 A1 | 3/2009 | Schmidt et al. | |
| 2009/0212697 A1 * | 8/2009 | Nakamura et al. | 313/506 |

FOREIGN PATENT DOCUMENTS

| | | |
|---|---|---|
| JP | 2002-261325 A | 9/2002 |
| JP | 2003-046133 A | 2/2003 |
| JP | 2006-324596 A | 11/2006 |
| JP | 2007-048864 | 2/2007 |
| JP | 2009-060031 A | 3/2009 |
| JP | 2009-534863 A | 9/2009 |
| JP | 2009-267040 | 11/2009 |
| JP | 2010-027704 A | 2/2010 |
| JP | 2010-141119 | 6/2010 |

OTHER PUBLICATIONS

Notification of Reasons for Refusal issued in JP Application No. 2010-149094, dated Jul. 16, 2013.
Notification of Reasons for Refusal issued in JP Application No.: 2010-149094, dispatched on Nov. 5, 2013.
Information Offer Form submitted with respect to JP Application No.: 2010-149094, on Aug. 22, 2013, and made available on Sep. 17, 2013, with a copy of the Notification showing a dispatch date of Sep. 17, 2013.

* cited by examiner

*Primary Examiner* — Marc Armand
(74) *Attorney, Agent, or Firm* — Sughrue Mion, PLLC

(57) ABSTRACT

A phosphor ceramic includes at least one fluorescent layer that is capable of emitting fluorescent light; and at least one non-fluorescent layer that does not emit fluorescent light and is laminated onto the fluorescent layer.

4 Claims, 2 Drawing Sheets

PHOSPHOR CERAMIC AND LIGHT-EMITTING DEVICE

CROSS-REFERENCE TO RELATED APPLICATION

The present application claims priority from Japanese Patent Application No. 2010-149094 filed on Jun. 30, 2010, the contents of which are hereby incorporated by reference into this application.

BACKGROUND OF THE INVENTION

1. Field of the Invention

The present invention relates to a phosphor ceramic and a light-emitting device including the phosphor ceramic.

2. Description of Related Art

Conventionally, as a phosphor that receives blue light and emits yellow light, a YAG (yttrium aluminum garnet) based phosphor where cerium is contained has been known. When the blue light is applied to the YAG based phosphor, white light can be obtained by mixing the applied blue light and the yellow light that the YAG based phosphor emits. Therefore, a white light emitting diode that is capable of obtaining white light by covering a blue light emitting diode with a YAG based phosphor to mix blue light from the blue light emitting diode and yellow light of the YAG based phosphor has been known.

There has been proposed, as such a YAG based phosphor, for example, a phosphor ceramic plate whose dopant (cerium) concentration and thickness are adjusted so as to realize the targeted luminescent chromaticity (ref: for example, Japanese Unexamined Patent Publication No. 2010-27704).

SUMMARY OF THE INVENTION

However, in the phosphor ceramic plate described in Japanese Unexamined Patent Publication No. 2010-27704, there is a need to form the phosphor ceramic plate thin so as to realize the targeted luminescent chromaticity and to ensure the light transmission characteristics, so that the mechanical strength of the phosphor ceramic plate is reduced.

When the mechanical strength of the phosphor ceramic plate is reduced, damage thereto occurs frequently, so that its handling may become difficult.

It is an object of the present invention to provide a phosphor ceramic that is capable of improving the mechanical strength while realizing the targeted luminescent chromaticity and ensuring the light transmission characteristics; and a light-emitting device including the phosphor ceramic.

A phosphor ceramic of the present invention includes at least one fluorescent layer that is capable of emitting fluorescent light; and at least one non-fluorescent layer that does not emit fluorescent light and is laminated onto the fluorescent layer.

In the phosphor ceramic of the present invention, it is preferable that the fluorescent layer and the non-fluorescent layer are laminated so that the one fluorescent layer is sandwiched between the two non-fluorescent layers.

In the phosphor ceramic of the present invention, it is preferable that the sum of the thickness of the fluorescent layer is 100 µm or less.

In the phosphor ceramic of the present invention, it is preferable that the fluorescent layer contains a base material and a fluorescence-imparting material for emitting fluorescent light; and the non-fluorescent layer does not contain the fluorescence-imparting material and contains the same base material as in the fluorescent layer.

A light-emitting device of the present invention includes a circuit board to which external electric power is supplied, a light emitting diode that is electrically connected onto the circuit board and emits light by electric power from the circuit board, a housing provided on the circuit board so as to surround the light emitting diode and the upper end portion thereof is disposed above the upper end portion of the light emitting diode, and the above-described phosphor ceramic provided on the housing.

The phosphor ceramic of the present invention includes a fluorescent layer and a non-fluorescent layer laminated thereon.

Therefore, the thickness of the fluorescent layer can be adjusted according to the targeted luminescent chromaticity and the light transmission characteristics, and the mechanical strength can be ensured with the non-fluorescent layer.

As a result, while capable of realizing the targeted luminescent chromaticity and ensuring the light transmission characteristics, it is possible to improve the mechanical strength.

The light-emitting device of the present invention includes the above-described phosphor ceramic, so that the phosphor ceramic can be easily provided on the housing and the targeted luminescent chromaticity and the light transmission characteristics can be easily ensured.

DETAILED DESCRIPTION OF THE INVENTION

Figure 1:
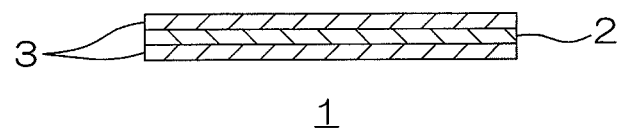
FIG. 1 shows a sectional view of an embodiment of a phosphor ceramic of the present invention.

FIG. 1 shows a sectional view of an embodiment of a phosphor ceramic of the present invention.

As shown in FIG. 1, a phosphor ceramic 1 includes one fluorescent layer 2 and two non-fluorescent layers 3 laminated on the fluorescent layer 2 so as to sandwich the fluorescent layer 2 therebetween. In the phosphor ceramic 1, the number and the laminating order of the fluorescent layer 2 and the non-fluorescent layer 3 are not particularly limited, and for example, the fluorescent layer 2 and the non-fluorescent layer 3 can be alternately laminated to form a laminate which has two or four layers or more.

The fluorescent layer 2 contains a phosphor that is excited by absorbing a part or all of the light whose wavelength is in the range of 350 to 480 nm as an exciting light, and emits fluorescent light whose wavelength is longer than that of the exciting light, for example, in the range of 500 to 650 nm.

An example of the phosphor contained in the fluorescent layer 2 includes the phosphor where, as a fluorescence-imparting material, a metal atom such as cerium (Ce) or europium (Eu) is doped into a base material such as a composite metal oxide or a metal sulfide.

To be specific, examples of the phosphor include garnet type phosphor having a garnet type crystal structure such as $Y_3Al_5O_{12}$:Ce (YAG (yttrium aluminum garnet):Ce) (base material: $Y_3Al_5O_{12}$, fluorescence-imparting material: Ce), $(Y, Gd)_3Al_5O_{12}$:Ce (base material: $(Y, Gd)_3Al_5O_{12}$, fluorescence-imparting material: Ce), $Tb_3Al_3O_{12}$:Ce (base material: $Tb_3Al_3O_{12}$, fluorescence-imparting material: Ce), $Ca_3Sc_2Si_3O_{12}$:Ce (base material: $Ca_3Sc_2Si_3O_{12}$, fluorescence-imparting material: Ce), and $Lu_2CaMg_2(Si, Ge)_3O_{12}$:Ce (base material: $Lu_2CaMg_2(Si, Ge)_3O_{12}$, fluorescence-imparting material: Ce); silicate phosphor such as $(Sr, Ba)_2SiO_4$:Eu (base material: $(Sr, Ba)_2SiO_4$, fluorescence-imparting material: Eu), $Ca_3SiO_4Cl_2$:Eu (base material: $Ca_3SiO_4Cl_2$, fluorescence-imparting material: Eu), $Sr_3SiO_5$:Eu (base material: $Sr_3SiO_5$, fluorescence-imparting material: Eu), $Li_2SrSiO_4$:Eu (base material: $Li_2SrSiO_4$, fluorescence-imparting material: Eu), and $Ca_3Si_2O_7$:Eu (base material: $Ca_3Si_2O_7$, fluorescence-imparting material: Eu); aluminate phosphor such as $CaAl_{12}O_{19}$:Mn (base material: $CaAl_{12}O_{19}$, fluorescence-imparting material: Mn) and $SrAl_2O_4$:Eu (base material: $SrAl_2O_4$, fluorescence-imparting material: Eu); sulfide phosphor such as ZnS:Cu, Al (base material: ZnS, fluorescence-imparting material: Cu, Al), CaS:Eu (base material: CaS, fluorescence-imparting material: Eu), $CaGa_2S_4$:Eu (base material: $CaGa_2S_4$, fluorescence-imparting material: Eu), and $SrGa_2S_4$:Eu (base material: $SrGa_2S_4$, fluorescence-imparting material: Eu); oxynitride phosphor such as $CaSi_2O_2N_2$:Eu (base material: $CaSi_2O_2N_2$, fluorescence-imparting material: Eu), $SrSi_2O_2N_2$:Eu (base material: $SrSi_2O_2N_2$, fluorescence-imparting material: Eu), $BaSi_2O_2N_2$:Eu (base material: $BaSi_2O_2N_2$, fluorescence-imparting material: Eu), and Ca-α-SiAlON; nitride phosphor such as $CaAlSiN_3$:Eu (base material: $CaAlSiN_3$, fluorescence-imparting material: Eu) and $CaSi_5N_8$:Eu (base material: $CaSi_5N_8$, fluorescence-imparting material: Eu); and fluoride-based phosphor such as $K_2SiF_6$:Mn (base material: $K_2SiF_6$, fluorescence-imparting material: Mn) and $K_2TiF_6$:Mn (base material: $K_2TiF_6$, fluorescence-imparting material: Mn). Preferably, garnet type phosphor is used, or more preferably, $Y_3Al_5O_{12}$:Ce is used.

A material that can be used in the non-fluorescent layer 3 does not have fluorescence characteristics without particular limitation. Preferably, the non-fluorescent layer 3 is formed from the same base material as that for the above-described fluorescent layer 2 without containing a fluorescence-imparting material. When the non-fluorescent layer 3 is formed from the same base material as that for the above-described fluorescent layer 2, the shrinkage rate of the fluorescent layer 2 and the non-fluorescent layer 3 at the time of sintering is similar, so that a ceramic green body which forms the fluorescent layer 2 and a ceramic green body which forms the non-fluorescent layer 3 can be laminated to be integrally sintered. In addition, for example, when the fluorescent layer 2 contains $Y_3Al_5O_{12}$:Ce, alumina whose shrinkage rate at the time of sintering is similar to that of $Y_3Al_5O_{12}$:Ce can be also used.

There may be a case where the fluorescence-imparting material in the fluorescent layer 2 is diffused toward the non-fluorescent layer 3 in the process of sintering. However, the case does not particularly damage the effect of the present invention.

To produce the phosphor ceramic 1, particles for the fluorescent layer to form the fluorescent layer 2 and particles for the non-fluorescent layer to form the non-fluorescent layer 3 are first produced.

To produce the particles for the fluorescent layer, when $Y_3Al_5O_{12}$:Ce is formed as a phosphor, for example, an yttrium-containing compound such as yttrium nitrate hexahydrate, an aluminum-containing compound such as aluminum nitrate enneahydrate, and a cerium-containing compound such as cerium nitrate hexahydrate are dissolved in a solvent such as distilled water at a predetermined proportion to prepare a precursor solution.

To prepare the precursor solution, an yttrium-containing compound, an aluminum-containing compound, and a cerium-containing compound are blended to be dissolved in a solvent so that an aluminum atom is in the range of, for example, 120 to 220 moles, or preferably 160 to 180 moles and a cerium atom is in the range of, for example, 0.2 to 5.0 moles, or preferably 0.5 to 2.0 moles with respect to 100 moles of yttrium atom.

Next, precursor particles are obtained by spraying and pyrolyzing the precursor solution. Although the precursor particles can be used as particles for the fluorescent layer as they are, the precursor particles are preferably temporarily calcined at, for example, 1000 to 1400° C., or preferably 1150 to 1300° C., for, for example, 0.5 to 5 hours, or preferably 1 to 2 hours to become the particles for the fluorescent layer.

When the precursor particles are temporarily calcined, the crystal phase of the obtained particles for the fluorescent layer can be adjusted, and therefore the fluorescent layer 2 at high density can be obtained.

The average particle size of the obtained particles for the fluorescent layer (measured by a BET (Brunauer-Emmett-Teller) method using an automatic surface area analyzer (manufactured by Micrometritics Instrument Corp., model Gemini 2365)) is in the range of, for example, 50 to 10000 nm, or preferably 50 to 1000 nm, or more preferably 50 to 500 nm.

When the average particle size of the particles for the fluorescent layer is within the above-described range, the usage of additives such as a binder resin (described later) can be reduced while capable of realizing the density growth of the fluorescent layer 2, the improvement of dimensional stability at the time of sintering, and the reduction of void generation.

An example of the particles for the fluorescent layer also includes a mixture by mixing yttrium-containing particles such as yttrium oxide particles, aluminum-containing particles such as aluminum oxide particles, and cerium-containing particles such as cerium oxide particles.

In this case, yttrium-containing particles, aluminum-containing particles, and cerium-containing particles are mixed so that an aluminum atom is in the range of, for example, 120 to 220 moles, or preferably 160 to 180 moles and a cerium atom is in the range of, for example, 0.2 to 5.0 moles, or preferably 0.5 to 2.0 moles with respect to 100 moles of yttrium atom.

The particles for the non-fluorescent layer are produced in the same manner as in the above-described production of the particles for the fluorescent layer except that a fluorescence-imparting material (Ce atom when forming $Y_3Al_5O_{12}$:Ce as a phosphor) is not blended.

Next, to produce the phosphor ceramic 1, a dispersion liquid of the particles for the fluorescent layer in which the particles for the fluorescent layer are dispersed and a dispersion liquid of the particles for the non-fluorescent layer in which the particles for the non-fluorescent layer are dispersed are prepared.

To prepare the dispersion liquid of the particles for the fluorescent layer, the particles for the fluorescent layer are dispersed into a solvent having volatility such as aromatic solvents including xylene and alcohols including methanol. To disperse the particles for the fluorescent layer into a solvent, additives such as a binder resin, dispersant, plasticizer and sintering additive can be appropriately blended. The additive is not particularly limited as long as it is decomposed by heat and a known additive can be used.

A method for dispersing the particles for the fluorescent layer into a solvent includes wet-blending using a known dispersing device such as a variety of mixers, ball mills, or bead mills.

The dispersion liquid of the particles for the non-fluorescent layer is prepared in the same manner as in the above-described production of the particles for the fluorescent layer by dispersing the particles for the non-fluorescent layer into a solvent.

Next, to produce the phosphor ceramic 1, a ceramic green sheet made from the particles for the fluorescent layer and a ceramic green sheet made from the particles for the non-fluorescent layer are produced.

The ceramic green sheet is produced as follows: the dispersion liquid of the particles for the fluorescent layer or the dispersion liquid of the particles for the non-fluorescent layer is subjected to viscosity control as required, and then is tape casted, for example, using a doctor blade method or is extruded and molded on a resin substrate such as a PET film to be dried. The thickness of each of the ceramic green sheets, when using the doctor blade method, is controlled by adjusting a gap of the doctor blade.

When adjusting the thickness of the ceramic green sheet to be 200 μm or more, the ceramic green sheet having a thickness of 200 μm or less is once produced so as to control a crack and a wave on the surface when the solvent dries. Then, in the laminating process of the ceramic green sheet described later, the targeted thickness of the sheet can be adjusted by stacking a plurality of the same ceramic green sheets.

Next, to produce the phosphor ceramic 1, a ceramic green sheet made from the particles for the fluorescent layer and a ceramic green sheet made from the particles for the non-fluorescent layer are laminated.

To laminate the ceramic green sheets, the obtained ceramic green sheets are first peeled off from the resin substrate.

Thereafter, the ceramic green sheet made from the particles for the fluorescent layer and the ceramic green sheet made from the particles for the non-fluorescent layer are laminated in a predetermined order (in the embodiment, one ceramic green sheet made from the particles for the fluorescent layer is sandwiched between two ceramic green sheets made from the particles for the non-fluorescent layer) to produce a ceramic green sheet laminate by, for example, thermal laminating.

To thermal laminate each of the ceramic green sheets, when the binder resin is blended into the dispersion liquid of the particles for the fluorescent layer or the dispersion liquid of the particles for the non-fluorescent layer, the thermal lamination is performed, for example, at a temperature in the neighborhood of a glass transition temperature of the binder resin.

Next, the ceramic green sheet laminate is heated in the air at, for example, 400 to 800° C. for, for example, 1 to 10 hours to perform the binder-removing treatment where additives are decomposed and removed. At this time, the temperature rising speed is, for example, 0.2 to 2.0° C./min. When the temperature rising speed is within the above-described range, a deformation of the ceramic green body or a crack and the like can be prevented.

Next, to produce the phosphor ceramic 1, the ceramic green sheet laminate is calcined.

The calcining temperature, duration, and calcining atmosphere are set appropriately according to the phosphor. When the phosphor is $Y_3Al_5O_{12}$:Ce, it is calcined at, for example, 1500 to 1800° C., or preferably 1650 to 1750° C. for, for example, 0.5 to 24 hours, or preferably 3 to 5 hours, for example, in a vacuum, under an inert gas atmosphere such as argon, or under a reducing gas such as hydrogen and hydrogen/nitrogen mixed gas.

When the laminate is calcined under a reducing atmosphere, carbon particles can be used in combination with a reducing gas. When carbon particles are used in combination, the reducing characteristics can further be improved.

The temperature rising speed up to the calcining temperature is, for example, 0.5 to 20° C./min. When the temperature rising speed is within the above-described range, while capable of efficiently increasing the temperature, crystal grains (grains) are grown comparatively moderately, and therefore the void generation can be suppressed. To further realize the density growth and to improve the translucency, the phosphor ceramic is sintered by a hot isostatic pressing method (HIP method) under increased pressure.

In this way, the production of the phosphor ceramic 1 is completed.

The total thickness of the fluorescent layer 2 of the phosphor ceramic 1 is, for example, 100 μm or less, or preferably 50 μm or less.

The thickness of the non-fluorescent layer 3 of the phosphor ceramic 1 is thicker than that of the fluorescent layer 2 and is in the range of, for example, 100 to 1000 μm, or preferably 200 to 500 μm.

The total thickness of the phosphor ceramic 1 is in the range of, for example, 100 to 1000 μm, or preferably 200 to 700 μm, or more preferably 300 to 500 μm.

When the total thickness of the phosphor ceramic 1 is within the above-described range, the handling thereof can be improved and damage thereto can be prevented.

The total luminous transmittance (at 700 nm) of the phosphor ceramic 1 is, for example, 40% or more, or preferably 50% or more.

The phosphor ceramic 1 includes the fluorescent layer 2 and the non-fluorescent layer 3 laminated thereon.

Therefore, while capable of adjusting the thickness of the fluorescent layer 2 according to the targeted luminescent chromaticity and the light transmission characteristics, the mechanical strength can be ensured with the non-fluorescent layer 3.

As a result, while capable of realizing the targeted luminescent chromaticity and ensuring the light transmission characteristics, the mechanical strength can be improved.

According to the phosphor ceramic 1, the fluorescent layer 2 is sandwiched between the two non-fluorescent layers 3.

Therefore, when the ceramic green sheet laminate is calcined, the outer non-fluorescent layers 3 are heated, and therefore the fluorescent layer 2 can be prevented from being directly heated.

As a result, it is possible to prevent formation of a part having low fluorescence characteristics on the surface of the fluorescent layer 2 due to calcination.

When the surface of the phosphor ceramic 1 is polished after calcination, the non-fluorescent layer 3 can be polished, so that the thickness change of the fluorescent layer 2 by the polishing can be prevented.

Figure 2:
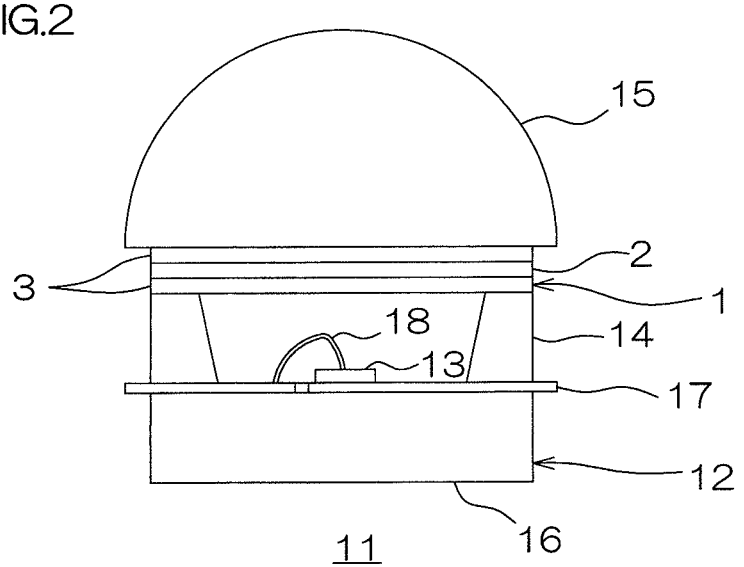
FIG. 2 shows a sectional view of an embodiment of a light-emitting device including the phosphor ceramic shown in FIG. 1 of the present invention.

FIG. 2 shows a sectional view of an embodiment of a light-emitting device including the phosphor ceramic shown in FIG. 1 of the present invention.

Next, a light-emitting device 11 including the phosphor ceramic 1 is described.

As shown in FIG. 2, the light-emitting device 11 includes a circuit board 12, a light emitting diode 13, a housing 14, and the phosphor ceramic 1.

The circuit board 12 includes a base board 16 and a wiring pattern 17 formed on the upper surface thereof. External electric power is supplied to the circuit board 12.

The base board 16 is formed into a generally rectangular flat plate shape in plane view and is formed from, for example, a metal such as aluminum, a ceramic material such as alumina, or a polyimide resin and the like.

The wiring pattern 17 electrically connects a terminal of the light emitting diode 13 to a terminal (not shown) of a power source (not shown) for supplying electric power to the light emitting diode 13. The wiring pattern 17 is formed from, for example, a conductive material such as copper and iron.

The light emitting diode 13 is provided on the base board 16. The light emitting diode 13 is electrically connected (wire bonding) to the wiring pattern 17 via a wire 18. The light emitting diode 13 emits light based on electric power from the circuit board 12.

The housing 14 is provided to stand upward from the upper surface of the base board 16 so that the upper end portion thereof is disposed above the upper end portion of the light emitting diode 13. The housing 14 is formed so as to surround the light emitting diode 13 in plane view.

The housing 14 is formed from, for example, a filler-added resin or ceramics. The reflectance of the housing 14 is set so that the reflectance with respect to the light from the light emitting diode 13 is, for example, 70% or more, or preferably 90% or more, or more preferably 95% or more.

The housing 14 can also be formed as a circuit board with a housing by integrally forming the housing 14 with the circuit board 12 preliminarily. As a circuit board with a housing, a commercially available product is available. For example, a ceramic multilayer board with cavity (part number: 207806, manufactured by Sumitomo Metal (SMI) Electronics Devices Inc.) is used.

In addition, a sealant such as a silicone resin is filled in the housing 14 as required.

The phosphor ceramic 1 is provided on the housing 14 so as to seal the upper end portion thereof and is adhered thereto via the sealant in the housing 14.

A lens 15 having a generally semi-sphere shape (generally dome shape) can be provided on the housing 14 so as to cover the phosphor ceramic 1 as required. The lens 15 is formed from, for example, a transparent resin such as a silicone resin.

To produce the light-emitting device 11, the housing 14 is first provided on the circuit board 12. Next, the light emitting diode 13 is provided in the housing 14 and the light emitting diode 13 and the circuit board 12 are electrically connected by the wire 18.

Next, the inside of the housing 14 is filled with the sealant as required and the phosphor ceramic 1 is provided on the housing 14.

Finally, the lens 15 is provided on the phosphor ceramic 1 via an adhesive as required to complete the production of the light-emitting device 11.

The light-emitting device 11 includes the fluorescent layer 2, the non-fluorescent layer 3, and the phosphor ceramic 1 whose strength is improved, so that the phosphor ceramic 1 can be easily provided on the housing 14, and therefore the targeted luminescent chromaticity can be easily realized.

In the above-described embodiment, the light-emitting device 11 having one light emitting diode 13 is shown. However, the number of the light emitting diode 13 provided on the light-emitting device 11 is not particularly limited and the light-emitting device 11 can be formed, for example, in a state of array where a plurality of the light emitting diodes 13 are arranged planarly (two-dimensionally) or linearly (one-dimensionally).

In the above-described embodiment, the lens 15 having a semi-sphere shape is provided on the phosphor ceramic 1. However, for example, a micro-lens array sheet and a diffusing sheet can be provided instead of the lens 15.

EXAMPLE

While in the following, the present invention is described based on Examples and Comparative Examples, the present invention is not limited to any of them by no means.

1. Production of Particles for Fluorescent Layer

Production Example 1

The components described below were dissolved in 1000 ml of distilled water to prepare 2M (the proportion of Ce atom with respect to Y atom: 1.25 atom %) of a precursor solution. The details of the components were as follows: 283.95 g of yttrium nitrate hexahydrate, 474.62 g of aluminum nitrate enneahydrate, and 4.07 g of cerium nitrate hexahydrate.

The precursor solution was sprayed and pyrolyzed at a speed of 10 ml/min in RF induction plasma flame using a two-fluid nozzle to obtain precursor particles.

The crystal phase of the obtained precursor particles was a mixed phase of amorphous and YAP (yttrium aluminum perovskite, $YAlO_3$) crystal when analyzed by an X-ray diffraction method.

The average particle size of the obtained precursor particles (measured by a BET (Brunauer-Emmett-Teller) method using an automatic surface area analyzer (manufactured by Micrometritics Instrument Corp., model Gemini 2365)) was about 75 nm.

Next, the obtained precursor particles were put in a crucible made of alumina and were temporarily calcined at 1200° C. for two hours in an electric furnace to obtain particles for the fluorescent layer (as described in YAG:Ce-1.25%).

The crystal phase of the obtained particles for the fluorescent layer was a single phase of YAG (yttrium aluminum garnet) crystal.

The average particle size of the obtained particles for the fluorescent layer was about 95 nm.

Production Example 2

Particles for the fluorescent layer (as described in YAG:Ce-0.5%) were obtained in the same manner as in the above-described Production Example 1 except that the mixing ratio of yttrium nitrate hexahydrate and cerium nitrate hexahydrate was adjusted so that the proportion of Ce atom with respect to Y atom was 0.5 atom %.

Production Example 3

Particles for the fluorescent layer (as described in YAG:Ce-0.125%) were obtained in the same manner as in the above-described Production Example 1 except that the mixing ratio of yttrium nitrate hexahydrate and cerium nitrate hexahydrate was adjusted so that the proportion of Ce atom with respect to Y atom was 0.125 atom %.

Production Example 4

The components described below were mixed to obtain particles for the fluorescent layer (as described in SSR-YAG:Ce-1.25%) where the proportion of Ce atom with respect to Y atom was 1.25 atom %. The details of the components were as follows: 11.233 g of yttrium oxide particles, 8.560 g of aluminum oxide particles, and 0.2167 g of cerium oxide particles.

2. Production of Particles for Non-Fluorescent Layer 11.412 g of yttrium oxide particles and 8.588 g of aluminum oxide particles were mixed to obtain particles for the non-fluorescent layer (as described in SSR-YAG).

3. Production of Phosphor Ceramic

Example 1

(1) Preparation of Dispersion Liquid of Particles for Fluorescent Layer

The components described below with respect to 20 g of the particles for the fluorescent layer obtained in the above-described Production Example 1 were charged in a vessel made of alumina to be wet blended at a speed of 1500 rpm for 24 hours with ball mill (yttrium stabilized zirconia ball having 3 mm of the diameter was used). The details of the components were as follows: 1.2 g of PVB (poly(vinyl butyral-co-vinyl alcohol-co-vinyl acetate) as a binder resin; 0.4 g of FlowlenG-700 (manufactured by KYOEISHA CHEMICAL CO., LTD) as a dispersant; 0.6 g of BBP (benzyl n-butyl phthalate) and 0.6 g of PEG (polyethylene glycol, molecular weight=400) as a plasticizer; 0.1 g of TEOS (tetraethoxysilane) as a sintering additive; and 6 ml of xylene and 6 ml of methanol as a solvent.

In this way, a dispersion liquid of the particles for the fluorescent layer in which the particles for the fluorescent layer were dispersed was prepared.

(2) Preparation of Dispersion Liquid of Particles for Non-fluorescent Layer

A dispersion liquid of the particles for the non-fluorescent layer in which the particles for the non-fluorescent layer were dispersed was prepared in the same manner as in the above-described dispersion liquid of the particles for the fluorescent layer by wet-blending using ball mill except that the particles for the non-fluorescent layer were used instead of the particles for the fluorescent layer.

(3) Production of Ceramic Green Sheet Laminate

The above-described dispersion liquid of the particles for the fluorescent layer and dispersion liquid of the particles for the non-fluorescent layer each were tape casted on a PET film by a doctor blade method to be dried naturally to thereby obtain the above-described respective ceramic green sheets made from the particles for the fluorescent layer or the particles for the non-fluorescent layer. The thickness of each of the ceramic green sheets was controlled by adjusting a gap of the doctor blade.

Each of the ceramic green sheets made from the particles for the fluorescent layer and the ceramic green sheets made from the particles for the non-fluorescent layer was peeled off from the PET film to be cut out in the size of 20 mm×20 mm.

Thereafter, one ceramic green sheet made from the particles for the fluorescent layer and two ceramic green sheets made from the particles for the non-fluorescent layer were laminated so that the one ceramic green sheet made from the particles for the fluorescent layer was sandwiched between the two ceramic green sheets made from the particles for the non-fluorescent layer to be thermal laminated at the temperature of 90° C. using a biaxial hot press.

In this way, a ceramic green sheet laminate was produced.

(4) Calcination of Ceramic Green Sheet Laminate

The obtained ceramic green sheet laminate was heated up to 800° C. at the temperature rising speed of 1° C./min in the air in an electric muffle furnace to perform the binder-removing treatment where an organic component such as a binder resin was decomposed and removed.

Thereafter, a sample was transferred into a high-temperature vacuum furnace and was heated up to 1700° C. at the temperature rising speed of 5° C./min in a vacuum of about $10^{-3}$ Torr to be calcined for five hours at the temperature, thereby producing a phosphor ceramic.

The phosphor ceramic shrank by about 20%, in both thickness and size, compared to the size of the ceramic green sheet laminate due to calcination.

The obtained phosphor ceramic had a structure as follows: non-fluorescent layer (150 μm)/fluorescent layer (42 μm)/non-fluorescent layer (150 μm), and the thickness of the entire layers was 342 μm.

Example 2

A phosphor ceramic having a structure as follows: non-fluorescent layer (150 μm)/fluorescent layer (71 μm)/non-fluorescent layer (150 μm), and the thickness of the entire layers was 371 μm, was produced in the same manner as in Example 1 except that the particles for the fluorescent layer obtained in Production Example 2 were used as the particles for the fluorescent layer.

Example 3

A phosphor ceramic having a structure as follows: non-fluorescent layer (150 μm)/fluorescent layer (58 μm)/non-fluorescent layer (150 μm), and the thickness of the entire layers was 358 μm, was produced in the same manner as in Example 1 except that the particles for the fluorescent layer obtained in Production Example 4 were used as the particles for the fluorescent layer.

Example 4

A phosphor ceramic having a structure as follows: non-fluorescent layer (200 μm)/fluorescent layer (42 μm)/non-fluorescent layer (50 μm), and the thickness of the entire layers was 292 μm, was produced in the same manner as in Example 1 except that the thickness of the non-fluorescent layer was changed. A ceramic green sheet made from the particles for the non-fluorescent layer was adjusted to 200 μm by stacking two ceramic green sheets of 100 μm.

Example 5

A phosphor ceramic having a structure as follows: non-fluorescent layer (250 μm)/fluorescent layer (42 μm)/non-fluorescent layer (250 μm), and the thickness of the entire layers was 542 μm, was produced in the same manner as in Example 4 except that the thickness of the non-fluorescent layer was adjusted to 250 μm by stacking a ceramic green sheet of 100 μm and a ceramic green sheet of 150 μm.

Example 6

A phosphor ceramic having a two-layer structure as follows: non-fluorescent layer (250 μm)/fluorescent layer (71 μm), and the thickness of the entire layers was 321 μm, was produced in the same manner as in Example 2 except that the non-fluorescent layer whose thickness was adjusted to 250 μm by stacking a ceramic green sheet of 100 μm and a ceramic green sheet of 150 μm, and the fluorescent layer were laminated to be a two-layer structure.

Comparative Example 1

The production of a phosphor ceramic provided only with a one-layer fluorescent layer (YAG:Ce-1.25% (thickness of 42 μm)) was attempted only from the ceramic green sheet made from the particles for the fluorescent layer obtained in Production Example 1.

However, the ceramic green sheet was so thin that its handling was difficult, and then warps and cracks frequently occurred at the time of binder-removing treatment and sintering. In addition, the obtained phosphor ceramic was easily cracked when being cut out, so that a flat sample having enough size could not be obtained.

Comparative Example 2

The production of a phosphor ceramic provided only with a one-layer fluorescent layer (YAG:Ce-0.5% (thickness of 71 μm)) was attempted only from the ceramic green sheet made from the particles for the fluorescent layer obtained in Production Example 2.

However, as in Comparative Example 1, the handling of the ceramic green sheet and the obtained phosphor ceramic was difficult, so that a flat sample having enough size could not be obtained.

Comparative Example 3

Two ceramic green sheets made from the particles for the fluorescent layer obtained in Production Example 2 were laminated to produce a phosphor ceramic provided only with a one-layer fluorescent layer (YAG:Ce-0.5% (thickness of 142 μm)).

Compared to each of Examples, a warp slightly occurred due to sintering.

Comparative Example 4

A phosphor ceramic provided only with a one-layer fluorescent layer (YAG:Ce-0.125% (thickness of 237 μm)) was produced only from the ceramic green sheet made from the particles for the fluorescent layer obtained in Production Example 3.

Comparative Example 5

A commercially available YAG phosphor powder (manufactured by PhosphorTech Corporation, part number: BYW01A, the average particle size: 9 μm) was dispersed into a two-liquid mixed type thermosetting silicone elastomer (manufactured by Shin-Etsu Chemical Co., Ltd., part number: KER2500) at the proportion of 20 mass % to prepare a phosphor dispersing liquid.

Next, the phosphor dispersing liquid was coated on a PET film with a thickness of about 200 μm using an applicator to be heated at 100° C. for one hour and at 150° C. for one hour, thereby producing a phosphor dispersing resin sheet.

The sheet was peeled off from the PET film to produce a YAG:Ce powder dispersing sheet by cutting the sheet in the size of 3.5 mm×2.8 mm.

4. Production of Light Emitting Diode Device for Evaluation

A blue light emitting diode chip (manufactured by Cree, Inc., part number: C450EZ1000-0123, 980 μm×980 μm×100 μmt) was die attached by Au—Sn solder in a cavity of a ceramic multilayer board with cavity (manufactured by Sumitomo Metal (SMI) Electronics Devices Inc., part number: 207806, outer size: 3.5 mm×2.8 mm, cavity: generally elliptical shape of 2.68 mm in the long axis direction, 1.98 mm in the short axis direction, and 0.6 mmt in height) to produce a light emitting diode package mounted with one blue light emitting diode chip by wire bonding from an electrode of the light emitting diode chip to a lead frame of the ceramic multilayer board by an Au wire.

Separately, phosphor ceramics or YAG:Ce powder dispersing sheets of Examples 1 to 6 and Comparative Examples 3 to 5 were cut out according to the outer size (3.5 mm×2.8 mm) of the light emitting diode package by a dicing device fully provided with a diamond blade.

A gel-like silicone resin was filled in the cavity and the cut-out phosphor ceramic or YAG:Ce powder dispersing sheet (3.5 mm×2.8 mm in size) was provided via the gel-like silicone resin to produce a light-emitting device.

A small amount of solder paste (product name: Chip Quick, part number: SMD291SNL) was applied to a solder pad provided on the bottom portion of the ceramic multilayer board. The applied one was disposed according to the electrode pattern of a commercially available star-shaped aluminum board (manufactured by The Bergquist Company, product name: Thermal Clad, part number: 803291) and the light-emitting device was soldered to the star-shaped aluminum board by reflowing the solder paste at 260° C.

Furthermore, the back surface of the star-shaped aluminum board was thinly applied with a thermal conductive grease (manufactured by ITW Chemtronics, part number: CT40-5) and was attached to a heat sink (manufactured by Wakefield Thermal Solutions, Inc., part number: 882-50AB) made of aluminum via the above-described grease.

5. Evaluation (1) Total Luminous Transmittance Measurement of Phosphor Ceramic

A transmittance measurement stage (manufactured by Otsuka Electronics Co., Ltd.) provided with an integrating sphere and a multi channel photo detector (manufactured by Otsuka Electronics Co., Ltd., MCPD 7000) were connected using a specialized optical fiber to measure the total luminous transmittance in the range of wavelength of 380 nm to 1000 nm.

To be specific, the spot size of the incident light at the time of measurement was adjusted to about 2mmϕ to allow the transmittance in a state where a phosphor ceramic was not provided to be 100% and the total luminous transmittance of phosphor ceramics of each of Examples and Comparative Examples was measured.

The total luminous transmittance showed a wavelength dependence with the absorption of the phosphor ceramic. However, as an indicator to evaluate transparency (diffusivity), the value of wavelength of 700 nm which was not absorbed in the fluorescent layer (YAG:Ce) was used. The results are shown in Table 1.

(2) Measurement of Light-emitting Characteristics in Light-emitting Device

A multi channel photo detector (manufactured by Otsuka Electronics Co., Ltd., MCPD 7000) and an integrating sphere whose inner diameter was 12 inches were connected using a specialized optical fiber to measure the emission spectrum of the light-emitting device in the range of wavelength of 380 nm to 1000 nm.

To be specific, the light-emitting device was placed at the center inside of the integrating sphere and a direct current of 100 mA was applied to a light emitting diode to be lit up. The emission spectrum was recorded more than 10 seconds later after the electric power supply for performance stabilization of the light emitting diode. The values of radiation intensity (mW) and CIE chromaticity (x, y) of the light emitting diode device were calculated from the obtained emission spectrum. The results are shown in Table 1.

(3) Temperature Measurement of Surface of Phosphor Ceramic

Figure 3:
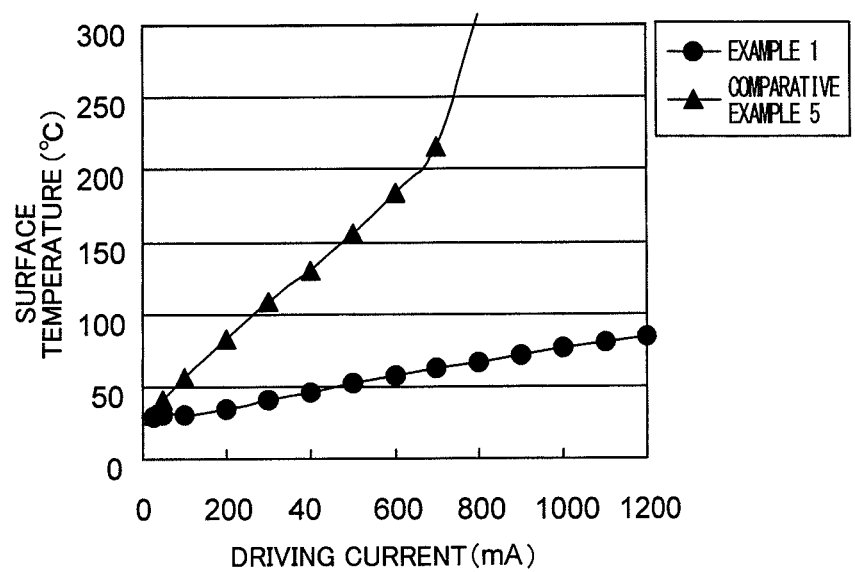
FIG. 3 shows a correlation diagram for illustrating a relation between a driving current of the light-emitting device and the surface temperature of the phosphor ceramic.

The temperature of the phosphor ceramic, when applying an electric current of 1A to a light emitting diode of the light-emitting device, was measured using an infrared camera (manufactured by FLIR Systems, Inc., product name: Infrared Camera A325). The results are shown in Table 1. In FIG. 3, a relation between a driving current of a sample and the surface temperature of the phosphor ceramic was shown.

TABLE 1

| | Laminating Structure of Phosphor Ceramic | Total Luminous Transmittance (%) | CIE Chromaticity (x, y) | Emission Color | Radiation Intensity (mW) | Surface Temperature (° C.) |
|---|---|---|---|---|---|---|
| Example 1 | SSR-YAG(150 μm)/YAG: Ce-1.25% (42 μm)/SSR-YAG(150 μm) | 72 | 0.32, 0.37 | white | 61 | 76 |
| Example 2 | SSR-YAG(150 μm)/YAG: Ce-0.5% (71 μm)/SSR-YAG(150 μm) | 69 | 0.31, 0.35 | white | 64 | 78 |
| Example 3 | SSR-YAG(150 μm)/SSR-YAG: Ce-1.25% (58 μm)/SSR-YAG(150 μm) | 74 | 0.32, 0.37 | white | 52 | 72 |
| Example 4 | SSR-YAG(200 μm)/YAG: Ce-1.25% (42 μm)/SSR-YAG(50 μm) | 76 | 0.30, 0.34 | white | 64 | 79 |
| Example 5 | SSR-YAG(250 μm)/YAG: Ce-1.25% (42 μm)/SSR-YAG(250 μm) | 59 | 0.33, 0.39 | white | 57 | 69 |
| Example 6 | SSR-YAG(250 μm)/YAG: Ce-0.5% (71 μm) | 74 | 0.31, 0.36 | white | 63 | 77 |
| Comparative Example 1 | YAG: Ce-1.25% (42 μm) | Production of Phosphor Ceramic is Impossible | | | | |
| Comparative Example 2 | YAG: Ce-0.5% (71 μm) | Production of Phosphor Ceramic is Impossible | | | | |
| Comparative Example 3 | YAG: Ce-0.5% (142 μm) | 79 | 0.40, 0.51 | yellow | 48 | 81 |
| Comparative Example 4 | YAG: Ce-0.125% (237 μm) | 72 | 0.34, 0.40 | white | 60 | 78 |
| Comparative Example 5 | YAG: Ce powder sheet | 59 | 0.35, 0.39 | white | 57 | >300 |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

What is claimed is:

1. A phosphor ceramic comprising:
at least one fluorescent layer that is capable of emitting fluorescent light; and
at least one non-fluorescent layer that does not emit fluorescent light and is laminated onto the fluorescent layer,
wherein the fluorescent layer is a sinter of a phosphor where a fluorescence-imparting material comprising a metal atom is doped into a base material comprising a composite metal oxide or a metal sulfide, and
the non-fluorescent layer is a sinter of a base material comprising the same composite metal oxide or the same metal sulfide as in the fluorescent layer.

2. The phosphor ceramic according to claim 1, wherein the fluorescent layer and the non-fluorescent layer are laminated so that the one fluorescent layer is sandwiched between the two non-fluorescent layers.

3. The phosphor ceramic according to claim 1, wherein the sum of the thickness of the fluorescent layer is 100 μm or less.

4. A light-emitting device comprising:
a circuit board to which external electric power is supplied;
a light emitting diode that is electrically connected onto the circuit board and emits light by electric power from the circuit board;
a housing provided on the circuit board so as to surround the light emitting diode and the upper end portion thereof is disposed above the upper end portion of the light emitting diode; and
the phosphor ceramic provided on the housing, wherein
the phosphor ceramic comprises at least one fluorescent layer that is capable of emitting fluorescent light; and at least one non-fluorescent layer that does not emit fluorescent light and is laminated onto the fluorescent layer,
wherein the fluorescent layer is a sinter of a phosphor where a fluorescence-imparting material comprising a metal atom is doped into a base material comprising a composite metal oxide or a metal sulfide, and
the non-fluorescent layer is a sinter of a base material comprising the same composite metal oxide or the same metal sulfide as in the fluorescent layer.

* * * * *